(12) United States Patent
Koshimizu

(10) Patent No.: US 12,266,511 B2
(45) Date of Patent: Apr. 1, 2025

(54) SUBSTRATE SUPPORT AND SUBSTRATE PROCESSING APPARATUS

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 296 days.

(21) Appl. No.: 17/104,038

(22) Filed: Nov. 25, 2020

(65) Prior Publication Data

US 2021/0159057 A1 May 27, 2021

(30) Foreign Application Priority Data

Nov. 26, 2019 (JP) .................................. 2019-213643
Jul. 15, 2020 (JP) .................................. 2020-121686

(51) Int. Cl.
H01J 37/32 (2006.01)

(52) U.S. Cl.
CPC .. *H01J 37/32642* (2013.01); *H01J 37/32082* (2013.01); *H01J 37/32568* (2013.01); *H01J 37/32577* (2013.01)

(58) Field of Classification Search
USPC ........................................................ 156/915
See application file for complete search history.

(56) References Cited

U.S. PATENT DOCUMENTS

| | | | | |
|---|---|---|---|---|
| 5,478,429 A * | 12/1995 | Komino | ............ | H01J 37/32082 118/724 |
| 5,998,932 A * | 12/1999 | Lenz | ................. | H01J 37/32623 118/728 |
| 2008/0236749 A1 | 10/2008 | Koshimizu et al. | | |
| 2010/0025369 A1 * | 2/2010 | Negishi | ............. | H01J 37/32935 216/60 |
| 2010/0203736 A1 * | 8/2010 | Ichino | ............... | H01J 37/32183 257/E21.218 |
| 2010/0326957 A1 * | 12/2010 | Maeda | .................... | H01J 37/20 156/345.26 |
| 2011/0000883 A1 | 1/2011 | Endoh et al. | | |
| 2017/0018411 A1 * | 1/2017 | Sriraman | .......... | H01J 37/32715 |
| 2019/0006155 A1 * | 1/2019 | Zhao | .................... | H01L 21/6831 |
| 2019/0198297 A1 * | 6/2019 | Aramaki | ........... | H01L 21/67069 |
| 2019/0228952 A1 * | 7/2019 | Dorf | ................... | H01L 21/6833 |
| 2020/0152429 A1 * | 5/2020 | Sasaki | ................. | H01L 21/6833 |

FOREIGN PATENT DOCUMENTS

| | | | |
|---|---|---|---|
| JP | 62-286249 | A | 12/1987 |
| JP | 2005-064460 | A | 3/2005 |
| JP | 2007-258417 | | 10/2007 |
| JP | 2011009351 | A | 1/2011 |
| JP | 2019-114612 | A | 7/2019 |
| KR | 20100138687 | A | 12/2010 |
| KR | 20170008138 | A | 1/2017 |
| KR | 20190004231 | A | 1/2019 |
| KR | 20190075783 | A | 7/2019 |

* cited by examiner

*Primary Examiner* — Ram N Kackar
(74) *Attorney, Agent, or Firm* — XSENSUS LLP

(57) ABSTRACT

Provided is a technique for stably applying a voltage to an edge ring. Provided is a substrate support including: a substrate mounting surface on which a substrate is mounted; an edge ring mounting surface on which an edge ring is mounted around the substrate mounting surface; and a conductive electrode formed on the edge ring mounting surface and configured to apply a voltage to the edge ring.

11 Claims, 10 Drawing Sheets

SUBSTRATE SUPPORT AND SUBSTRATE PROCESSING APPARATUS

CROSS-REFERENCE TO RELATED APPLICATIONS

This application claims the benefit of Japanese Patent Application Nos. 2019-213643 filed on Nov. 26, 2019, and 2020-121686 filed on Jul. 15, 2020, the entire disclosures of each are incorporated herein by reference.

TECHNICAL FIELD

The present disclosure relates to a substrate support and a substrate processing apparatus.

BACKGROUND

For example, Japanese Patent Application Publication No. 2007-258417 discloses a plasma processing apparatus in which a focus ring is disposed so as to surround a substrate mounted on an electrostatic chuck. A DC voltage is applied to the focus ring to adjust an upper end position of the sheath on the focus ring.

SUMMARY

The disclosure is directed to a technique for stably applying a voltage to an edge ring.

According to one aspect of the disclosure, there is provided a substrate support including: a substrate mounting surface on which a substrate is mounted; an edge ring mounting surface on which an edge ring is mounted around the substrate mounting surface; and a conductive electrode formed on the edge ring mounting surface and configured to provide a voltage to the edge ring.

According to the disclosure, a technique for stably providing a voltage to the edge ring is provided.

DETAILED DESCRIPTION

Figure 1:
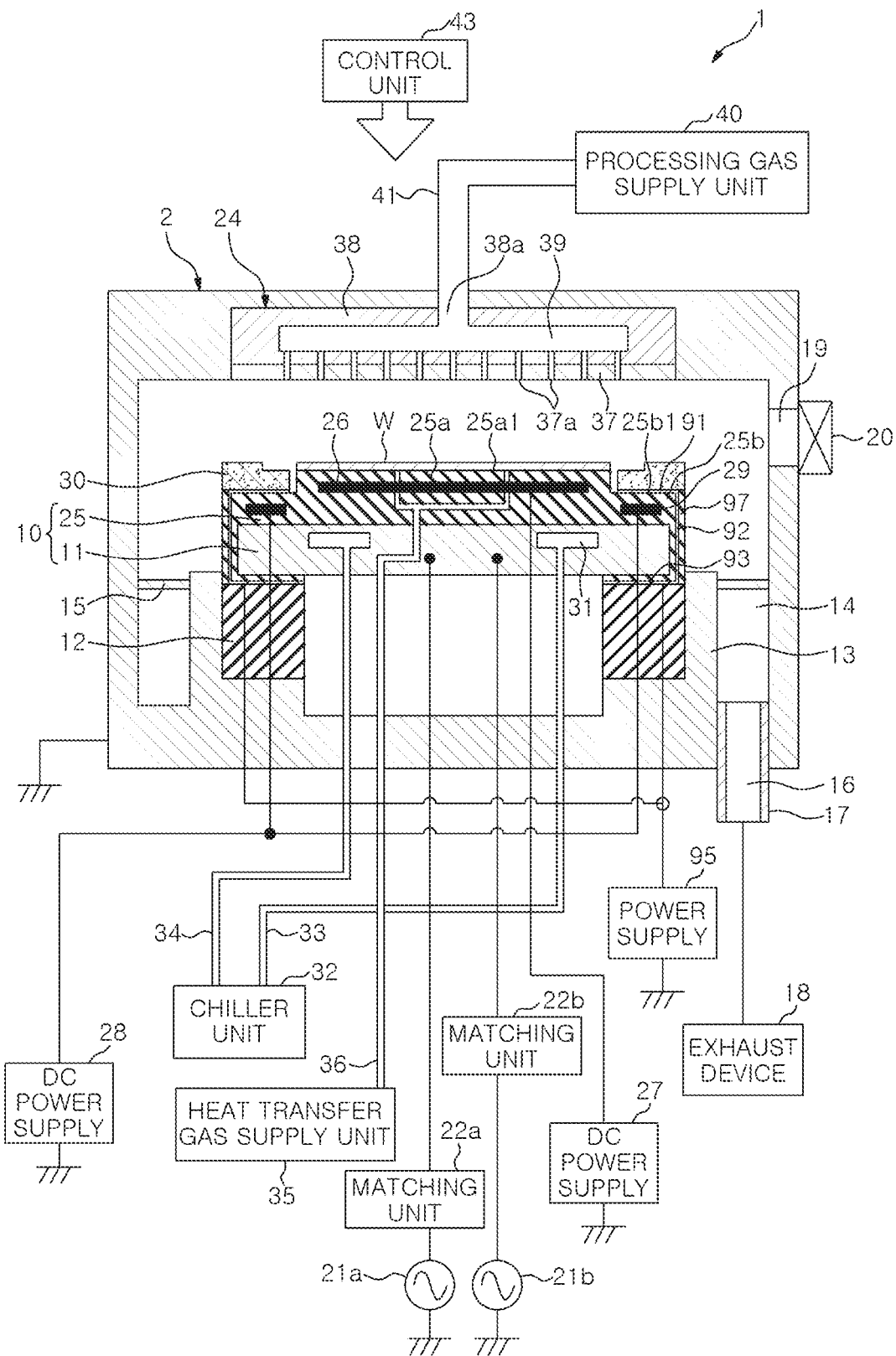
FIG. 1 is a cross-sectional view illustrating a schematic configuration of a substrate processing apparatus according to an embodiment.

Hereinafter, modes for carrying out the disclosure will be described with reference to the drawings. In addition, in this specification and the drawings, substantially the same configurations will be denoted by the same reference numerals to omit redundant description.

<Overall Configuration of Substrate Processing Apparatus>

First, an example of the overall configuration of a substrate processing apparatus 1 will be described with reference to FIG. 1. FIG. 1 is a cross-sectional view illustrating a schematic configuration of the substrate processing apparatus 1 according to the embodiment. In the embodiment, the substrate processing apparatus 1 of a reactive ion etching (RIE) type substrate processing apparatus will be described. The substrate processing apparatus 1 may be any type of plasma etching apparatus, a plasma chemical vapor deposition (CVD) apparatus.

The substrate processing apparatus 1 in FIG. 1 has a grounded cylindrical processing chamber 2 made of metal, for example, aluminum or stainless steel, and a disc-shaped substrate support 10 is provided inside the processing chamber 2. The substrate support 10 includes a base 11 and an electrostatic chuck 25 on the base 11. The base 11 functions as a lower electrode. The base 11 is made of, for example, aluminum. The base 11 is supported by a cylindrical support portion 13 extending vertically upward from the bottom of the processing chamber 2 via an insulating cylindrical holding member 12.

An exhaust passage 14 is formed between the side wall of the processing chamber 2 and the cylindrical support portion 13, an annular baffle plate 15 is disposed at the inlet or midway of the exhaust passage 14, and an exhaust port 16 is provided at the bottom, and an exhaust device 18 is connected to the exhaust port 16 via an exhaust pipe 17. Herein, the exhaust device 18 may include a dry pump or other types of vacuum pumps and decompresses a processing space in the processing chamber 2 to a predetermined degree of vacuum. In addition, the exhaust pipe 17 has an automatic pressure control valve (hereinafter, referred to as an "APC") which is a variable butterfly valve, and the APC automatically controls the pressure in the processing chamber 2. Moreover, a gate valve 20 that opens and closes a loading/unloading port 19 for the substrate W is provided adjacent to the side wall of the processing chamber 2.

A first radio frequency power supply 21*a* is connected to the base 11 via a first matching unit 22*a*. In addition, a second radio frequency power supply 21*b* is connected to the base 11 via a second matching unit 22*b*. The first radio frequency power supply 21*a* supplies a radio frequency power for plasma generation having a predetermined frequency (for example, 100 MHz) to the base 11. The second radio frequency power supply 21*b* supplies a radio frequency power for ion attraction having a predetermined frequency (for example, 13 MHz) lower than that of the first radio frequency power supply 21*a* to the base 11.

A shower head 24 which also functions as an upper electrode is provided on the ceiling of the processing chamber 2. Accordingly, radio frequency voltages of two frequencies from the first radio frequency power supply 21*a* and the second radio frequency power supply 21*b* are supplied to perform plasma processing between the base 11 and the shower head 24.

The electrostatic chuck 25 that attracts the substrate W by an electrostatic attraction force is provided on the upper surface of the base 11. The electrostatic chuck 25 has a disc-shaped central portion 25*a* on which the substrate W is mounted and an annular outer peripheral portion 25*b* formed so as to surround the central portion 25*a*. The central portion 25*a* projects upward with respect to the outer peripheral portion 25*b*. The upper surface of the central portion 25*a* is a substrate mounting surface 25*a*1 on which the substrate W is mounted. The upper surface of the outer peripheral portion 25*b* is an edge ring mounting surface 25*b*1 on which an edge ring 30 is mounted. The edge ring 30 is mounted on the edge ring mounting surface 25*b*1 around the substrate mounting surface 25*a*1. The edge ring 30 is also referred to as a focus ring. In addition, the central portion 25*a* is configured by interposing an electrode plate 26 made of a conductive film between a pair of dielectric films. A DC power supply 27 is electrically connected to the electrode plate 26. The outer peripheral portion 25*b* is configured by interposing an electrode plate 29 made of a conductive film between a pair of dielectric films. A DC power supply 28 is electrically connected to the electrode plate 29.

In the DC power supply 27 and the DC power supply 28, the level and polarity of the DC voltage to be applied can be changed. The DC power supply 27 applies a DC voltage to the electrode plate 26 under the control of a control unit 43 described later. The DC power supply 28 applies a DC voltage to the electrode plate 29 under the control of the control unit 43. The electrostatic chuck 25 generates an electrostatic force such as a Coulomb force by the voltage applied to the electrode plate 26 from the DC power supply 27 and attracts and holds the substrate W on the electrostatic chuck 25 by the electrostatic force. In addition, the electrostatic chuck 25 generates an electrostatic force such as a Coulomb force by the voltage applied to the electrode plate 29 from the DC power supply 28 and attracts and holds the edge ring 30 to the electrostatic chuck 25 by the electrostatic force.

In addition, with respect to the electrostatic chuck 25 according to the embodiment, the electrostatic chuck for the substrate W and the electrostatic chuck for the edge ring 30 are integrated, but the electrostatic chuck for the substrate W and the electrostatic chuck for the edge ring 30 may be different (separate) electrostatic chucks. That is, the electrode plate 26 and the electrode plate 29 may be disposed between independent dielectric films. In addition, although the electrode plate 29 according to the embodiment is a unipolar electrode, the electrode plate may be a bipolar electrode. In the case of bipolar, the edge ring 30 can be attracted even when plasma is not present.

Figure 2:
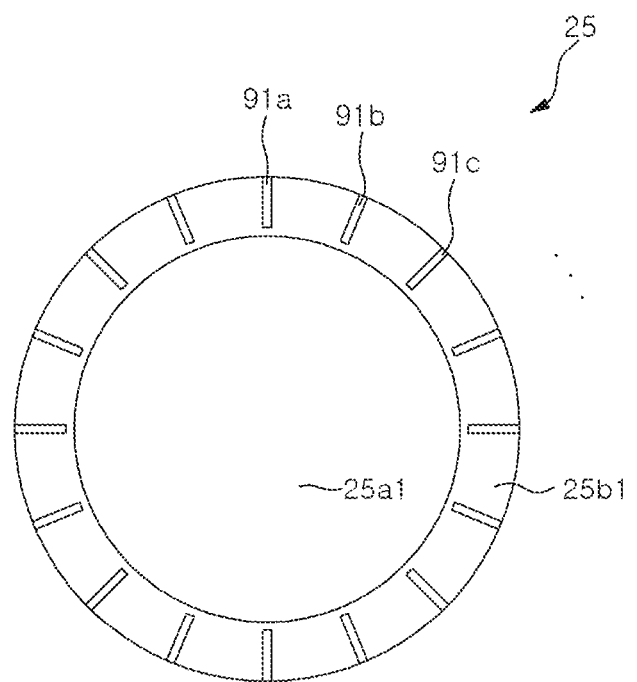
FIG. 2 is a top view of an electrostatic chuck of the substrate processing apparatus according to the embodiment.

A power feeding portion 91 made of a conductive electrode for applying a voltage to the edge ring 30 is formed on the edge ring mounting surface 25*b*1 of the electrostatic chuck 25. FIG. 2 is a top view of the electrostatic chuck 25 of the substrate processing apparatus 1 according to the embodiment. With respect to the power feeding portion 91, a plurality of the power feeding portions 91 such as power feeding portions 91*a*, 91*b*, 91*c*, . . . are formed at equal intervals in the circumferential direction on the edge ring mounting surface 25*b*1. In addition, the power feeding portions 91 are provided radially. The power feeding portions 91 are provided outside the substrate mounting surface 25*a*1. In some cases, the individual power feeding portions 91*a*, 91*b*, 91*c*, . . . may be collectively referred to as the power feeding portion 91. In addition, the power feeding portion 91 may be provided in a ring shape on the edge ring mounting surface 25*b*1. In addition, a wiring 92 and a wiring 93 are provided for feeding power to the power feeding portion 91. In addition, a protective layer 97 is provided on the side surface of the substrate support 10 to protect the wiring 92. The power feeding portion 91 is connected to a power supply 95 via the wiring 92 and the wiring 93. In addition, the details of the power feeding portion 91, the wiring 92, and the wiring 93 will be described later.

For example, an annular cooling medium chamber 31 extending in the circumferential direction is provided inside the base 11. A cooling medium having a predetermined temperature, for example, cooling water is supplied from a chiller unit 32 and circulated to the cooling medium chamber 31 via pipes 33 and 34, and the processing temperature of the substrate W on the electrostatic chuck 25 is controlled by the temperature of the cooling medium. In addition, the cooling medium is a temperature adjusting medium that is circulated and supplied to the pipes 33 and 34. In some cases, the temperature adjusting medium may not only cool but also heat the base 11 and the substrate W.

In addition, a heat transfer gas supply unit 35 is connected to the electrostatic chuck 25 via a gas supply line 36. The heat transfer gas supply unit 35 supplies the heat transfer gas to a space between the central portion 25*a* of the electrostatic chuck 25 and the substrate W through the gas supply line 36. As the heat transfer gas, a gas having thermal conductivity, such as He gas, is preferably used.

The shower head 24 on the ceiling has an electrode plate 37 on the lower surface having a large number of gas vent holes 37*a* and an electrode support 38 that detachably supports the electrode plate 37. A buffer chamber 39 is provided inside the electrode support 38, and a processing gas supply unit 40 is connected to a gas introduction port 38*a* communicating with the buffer chamber 39 via a gas supply pipe 41.

Each component of the substrate processing apparatus 1 is connected to the control unit 43. For example, the exhaust device 18, the first radio frequency power supply 21*a*, the second radio frequency power supply 21*b*, the DC power supply 27, the DC power supply 28, the power supply 95, the chiller unit 32, the heat transfer gas supply unit 35, and the processing gas supply unit 40 are connected to the control unit 43. The control unit 43 controls each component of the substrate processing apparatus 1.

The control unit 43 includes a central processing unit (CPU) (not illustrated) and a storage device such as a memory and allows the substrate processing apparatus 1 to execute a desired process by reading and executing a program and a processing recipe stored in the storage device. For example, the control unit 43 performs an electrostatic attraction process for electrostatically attracting the edge ring 30.

In the substrate processing apparatus 1, before starting a dry etching process, the gate valve 20 is set to the opened state, so that the substrate W to be processed is loaded into the processing chamber 2 and mounted on the electrostatic chuck 25. Then, in the substrate processing apparatus 1, a processing gas (for example, a mixed gas containing $C_4F_8$ gas, $O_2$ gas, and Ar gas) is introduced into the processing chamber 2 from the processing gas supply unit at a predetermined flow rate and a predetermined flow rate ratio, and the pressure in the processing chamber 2 is set to a predetermined value by the exhaust device 18 and the like.

Furthermore, in the substrate processing apparatus 1, radio frequency powers having different frequencies are supplied from the first radio frequency power supply 21a and the second radio frequency power supply 21b to the base 11. In addition, in the substrate processing apparatus 1, a DC voltage is applied from the DC power supply 27 to the electrode plate 26 of the electrostatic chuck 25 to attract the substrate W to the electrostatic chuck 25. In addition, in the substrate processing apparatus 1, by applying a DC voltage from the DC power supply 28 to the electrode plate of the electrostatic chuck 25, the edge ring 30 is attracted to the electrostatic chuck 25. The processing gas ejected from the shower head 24 is turned into plasma, and the substrate W is etched by radicals and ions in the plasma.

<Power Feeding Structure to Power Feeding Portion 91>

With respect to the substrate processing apparatus 1 according to the embodiment, a structure for feeding power to the power feeding portion 91 formed on the edge ring mounting surface 25b1 will be described.

Figure 3:
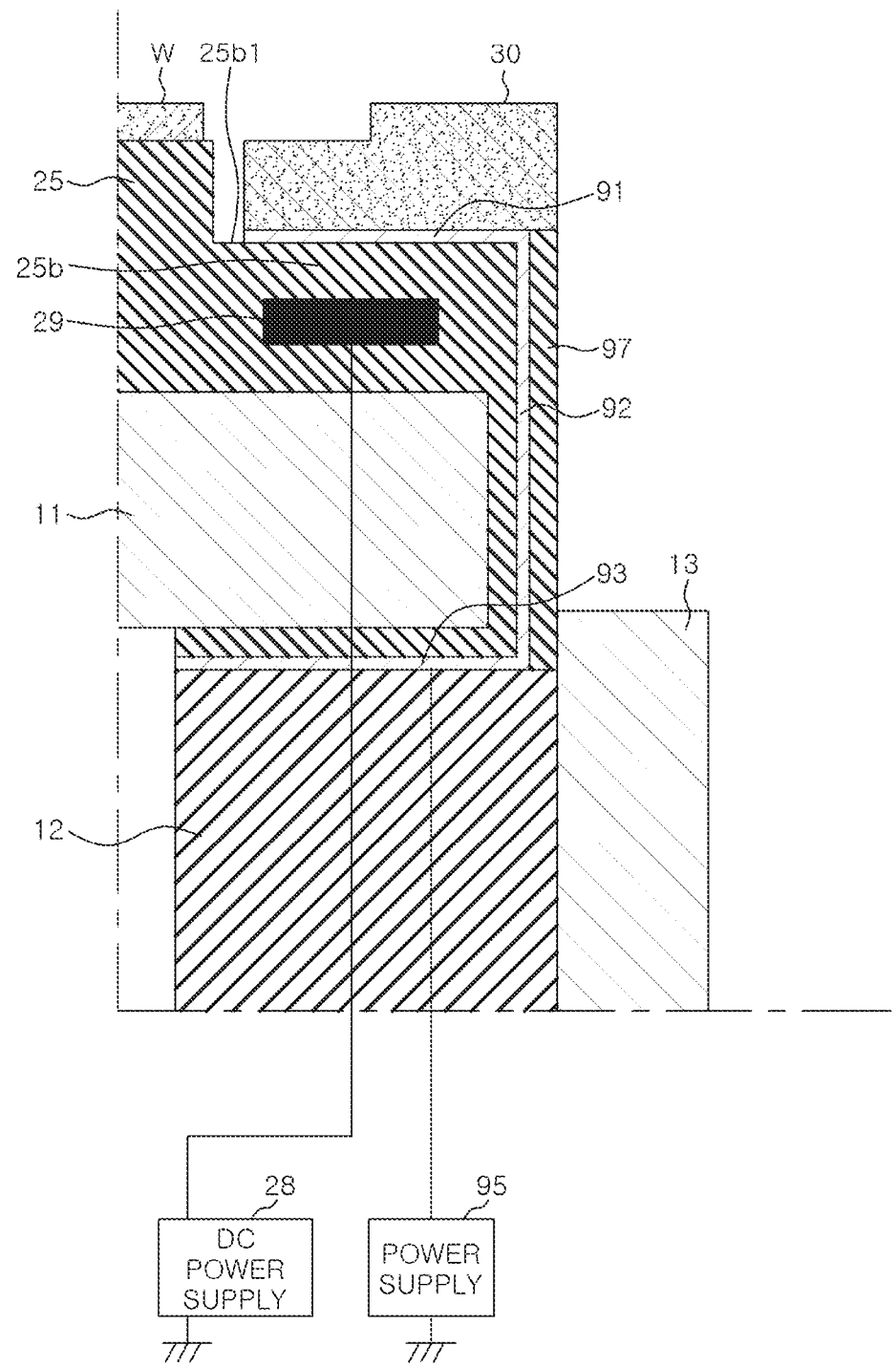
FIG. 3 is a diagram describing power feeding to an edge ring of the substrate processing apparatus according to the embodiment.

FIG. 3 is a diagram describing power feeding to the edge ring of the substrate processing apparatus according to the embodiment. Specifically, FIG. 3 is an enlarged cross-sectional view near the edge ring 30.

The power feeding portion 91, a conductive electrode, is disposed on the edge ring mounting surface 25b1 of the outer peripheral portion 25b of the electrostatic chuck 25. The power feeding portion 91 may be made of a conductor such as a metal or an alloy and is made of, for example, gold, aluminum, tungsten, nickel, germanium, antimony, tellurium, tantalum, titanium, ruthenium, platinum, molybdenum, tin, indium, or an alloy containing any one thereof. The power feeding portion 91 is formed by, for example, a vapor deposition method such as physical vapor deposition (PVD) or chemical vapor deposition (CVD), a liquid phase growth method such as plating, coating, sol-gel, or spin coating, or furthermore, thermal spraying, or printing. The thickness of the power feeding portion 91 may be any thickness as long as the edge ring 30 is attracted into the electrostatic chuck 25. However, in a case where a heat transfer gas (for example, He gas) is supplied from the edge ring mounting surface 25b1 in order to cool the edge ring 30, it is preferable that the projecting height of the electrode (thickness of the electrode) is 5 μm or less. In addition, a portion of the edge ring mounting surface 25b1 may be dug down to form an electrode on the bottom, and the height of the electrode surface of the power feeding portion 91 and the height of the surface of the edge ring mounting surface 25b1 may be matched. In this case, it is preferable to perform a process of attaching the electrodes and, after that, allowing the heights to be uniform. The power feeding portion 91 is an example of a conductive electrode that is formed on the edge ring mounting surface 25b1 and configured to supply a voltage to the edge ring 30.

As illustrated in FIG. 2, the power feeding portions 91 according to the embodiment are provided at equal intervals in the circumferential direction on the edge ring mounting surface 25b1. This is because a DC voltage or an RF power for controlling the edge ring is applied to the edge ring 30 by the electrostatic chuck 25. However, in a case where the edge ring 30 is not attracted to the electrostatic chuck 25, the power feeding portion 91 may be formed on the entire surface of the edge ring mounting surface 25b1.

The wirings 92 are provided on the side surfaces of the electrostatic chuck 25 and the base 11 via a dielectric film (for example, a ceramic) used for the electrostatic chuck 25. The dielectric film is formed by thermally spraying a ceramic. The wiring 92 may be made of a conductor such as a metal or an alloy and is made of, for example, gold, aluminum, tungsten, nickel, germanium, antimony, tellurium, tantalum, titanium, ruthenium, platinum, molybdenum, tin, indium, or an alloy containing any one thereof. The wiring 92 is formed by, for example, a vapor deposition method such as physical vapor deposition (PVD) or chemical vapor deposition (CVD), a liquid phase growth method such as plating, coating, sol-gel, or spin coating, or furthermore, thermal spraying, or printing. The wiring connects between the power feeding portion 91 and the wiring 93 on the lower surface of the base 11. The wiring 92 is an example of a first wiring connected to the power feeding portion 91. In addition, the wiring 92 may have a penetrating structure while being insulated from the base 11 and the electrode plate 29.

The wiring 93 is provided on the lower surface (back surface) of the base 11 via a dielectric film (for example, a ceramic). The wiring 93 may be made of a conductor such as a metal or an alloy and is made of, for example, gold, aluminum, tungsten, nickel, germanium, antimony, tellurium, tantalum, titanium, ruthenium, platinum, molybdenum, tin, indium, or an alloy containing any one thereof. In addition, in a case where the lower surface (back surface) of the base 11 is in the atmosphere, the wiring 93 may be made of copper or a copper alloy. The wiring 93 is formed by, for example, a vapor deposition method such as physical vapor deposition (PVD) or chemical vapor deposition (CVD), a liquid phase growth method such as plating, coating, sol-gel, or spin coating, or furthermore, thermal spraying, printing, or the like. The wiring 93 is connected to the power supply 95. The power supply 95 supplies a DC voltage or an RF pulse to the power feeding portion 91. The DC voltage may be applied in a pulse shape. RF may be supplied continuously. In addition, power in any waveform may be supplied. RF may be a radio frequency power output from the first radio frequency power supply 21a, may be a radio frequency power output from the second radio frequency power supply 21b, or may be both of the radio frequency powers.

When the edge ring 30 is worn out, the position of the sheath is changed. The power supply 95 feeds power to the edge ring 30 so as to adjust the changed position of the sheath. The wiring 93 is an example of a second wiring connected to the wiring 92 which is an example of the first wiring. It is preferable that the wirings 92 and 93 are configured as a cylinder and a donut-shaped disc or, if not, lead wires or the like that are equally distributed in order to secure plasma uniformity. In addition, the power feeding to the wiring 93 is not limited to the power feeding from the power supply 95. For example, the current fed to the base 11 and the electrode plates 26 and 29 may be adjusted by the variable impedance element to feed power to the wiring 93.

The protective layer 97 is provided on the side surface of the substrate support 10 to protect the wiring 92. The protective layer 97 is made of, for example, a ceramic. In the case of a ceramic, the protective layer is formed by thermally spraying the ceramic.

Function and Effect

In the substrate support 10 according to the embodiment, the power feeding portion 91 is provided on the edge ring mounting surface 25b1 on which the edge ring 30 is mounted. Therefore, the voltage can be applied stably to the edge ring 30. Furthermore, the edge ring 30 can be held on the edge ring mounting surface 25b1 by attracting the edge ring 30 by the electrostatic chuck 25 of the substrate support 10. In this manner, the edge ring 30 is held on the edge ring mounting surface 25b1 and the power feeding portion 91 is pressed against the edge ring mounting surface 25b1 by the edge ring 30, so that it is possible to more stably secure the contact state with the edge ring 30 and it is possible to apply the voltage with good reproducibility.

As Reference Example, for example, considered is the case of feeding power while pressing the side surface of the edge ring 30 by a pressing member or the like. In order to stably feed power to the edge ring 30, it is necessary to press the edge ring 30 by the pressing member with a predetermined load or more. When the edge ring 30 is pressed by the pressing member with a strong load, the position of the edge ring 30 may be shifted, or the edge ring 30 may be deformed. On the other hand, in the substrate support 10 according to the embodiment, power can be fed by mounting the edge ring 30 on the edge ring mounting surface 25b1. Due to the attraction force when the edge ring 30 is mounted, the power feeding portion 91 and the edge ring 30 can be sufficiently in contact with each other. Accordingly, it is possible to stably feed power to the edge ring 30. In addition, by mounting the edge ring 30 on the edge ring mounting surface 25b1 to feed power, it is possible to prevent the deformation and shift of the edge ring 30 as described above. In addition, although the edge ring 30 is worn out and needs to be replaced, the edge ring 30 can be easily detached only by turning off the electrostatic attraction of the edge ring 30. Therefore, the edge ring 30 can be easily detached, so that the replacement work and the automatic replacement can be completed simply and quickly.

Furthermore, in the substrate support 10 according to the embodiment, the wiring 93 is provided on the lower surface of the substrate support 10. For example, an elastic member connected to the power supply 95 may be provided on the upper surface of the cylindrical holding member 12, and the elastic member may be allowed to be in contact with the wiring 93 provided on the lower surface of the substrate support 10 to feed power. By doing so, power can be fed to the power feeding portion 91 by mounting the substrate support 10 on the cylindrical holding member 12. In this manner, the work at the time of manufacturing and installing the substrate processing apparatus 1 can be simplified.

Modified Example 1

Hereinafter, Modified Example of the method of feeding power to the power feeding portion 91 will be described. In addition, in the following Modified Examples, the connection with a terminal 100 provided on the cylindrical holding member 12 will be described. In addition, the power supply 95 is connected to the terminal 100 to supply power.

Figure 4:
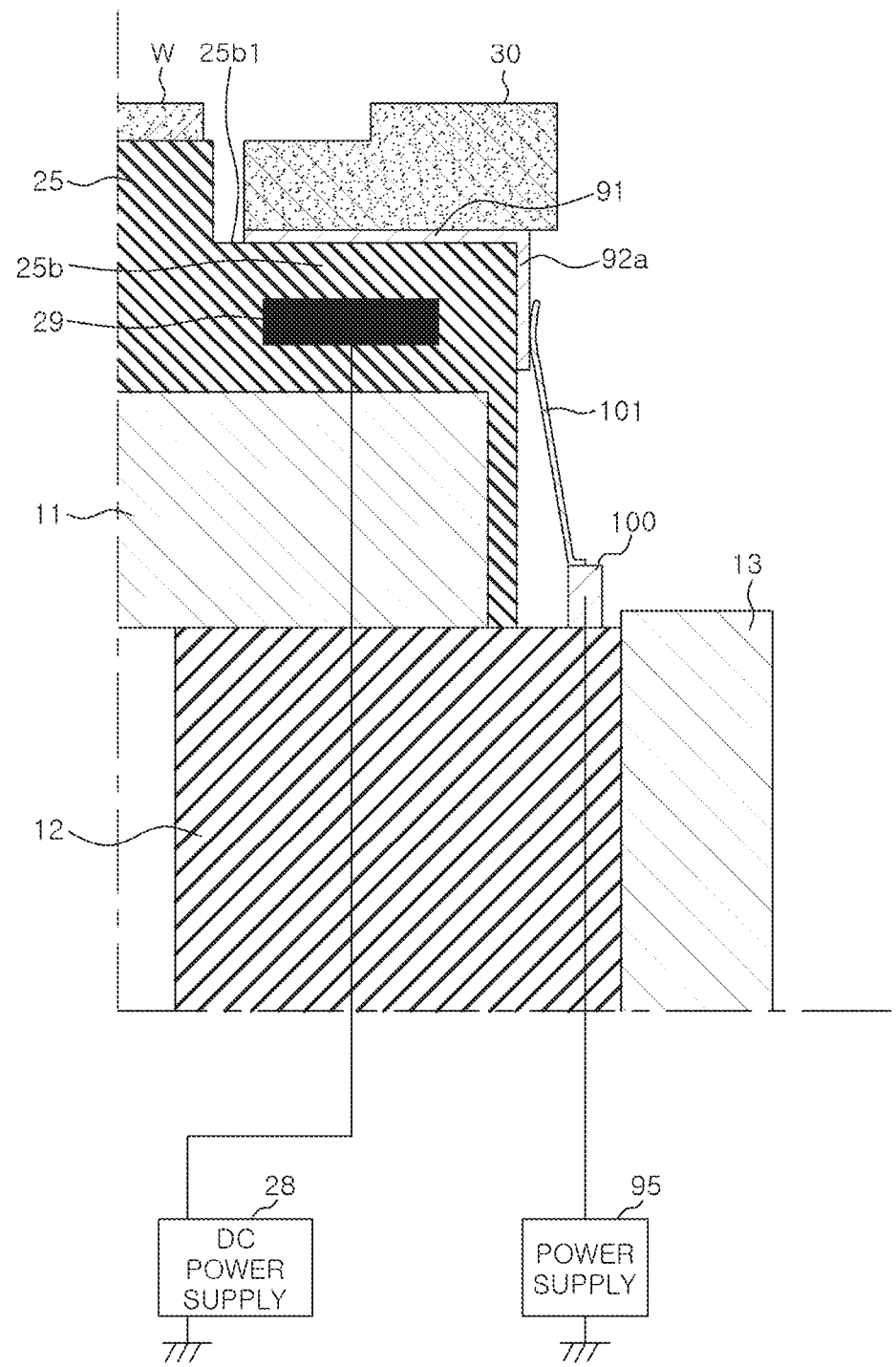
FIG. 4 is a diagram describing Modified Example of power feeding to the edge ring of the substrate processing apparatus according to the embodiment.

FIG. 4 is a diagram describing Modified Example 1 of power feeding to the edge ring 30 of the substrate processing apparatus 1 according to the embodiment. In Modified Example 1, the terminal 100 and a wiring 92a are connected by a spring contactor 101. The wiring 92a is provided on the side surface of the electrostatic chuck 25. The spring contactor 101 feeds power to the wiring 92a while pressing the side surface of the wiring 92a. In this manner, power can be stably fed to the edge ring 30. The spring contactor 101 is an example of an elastic member that feeds power while pressing the side surface of the first wiring.

Modified Example 2

Figure 5:
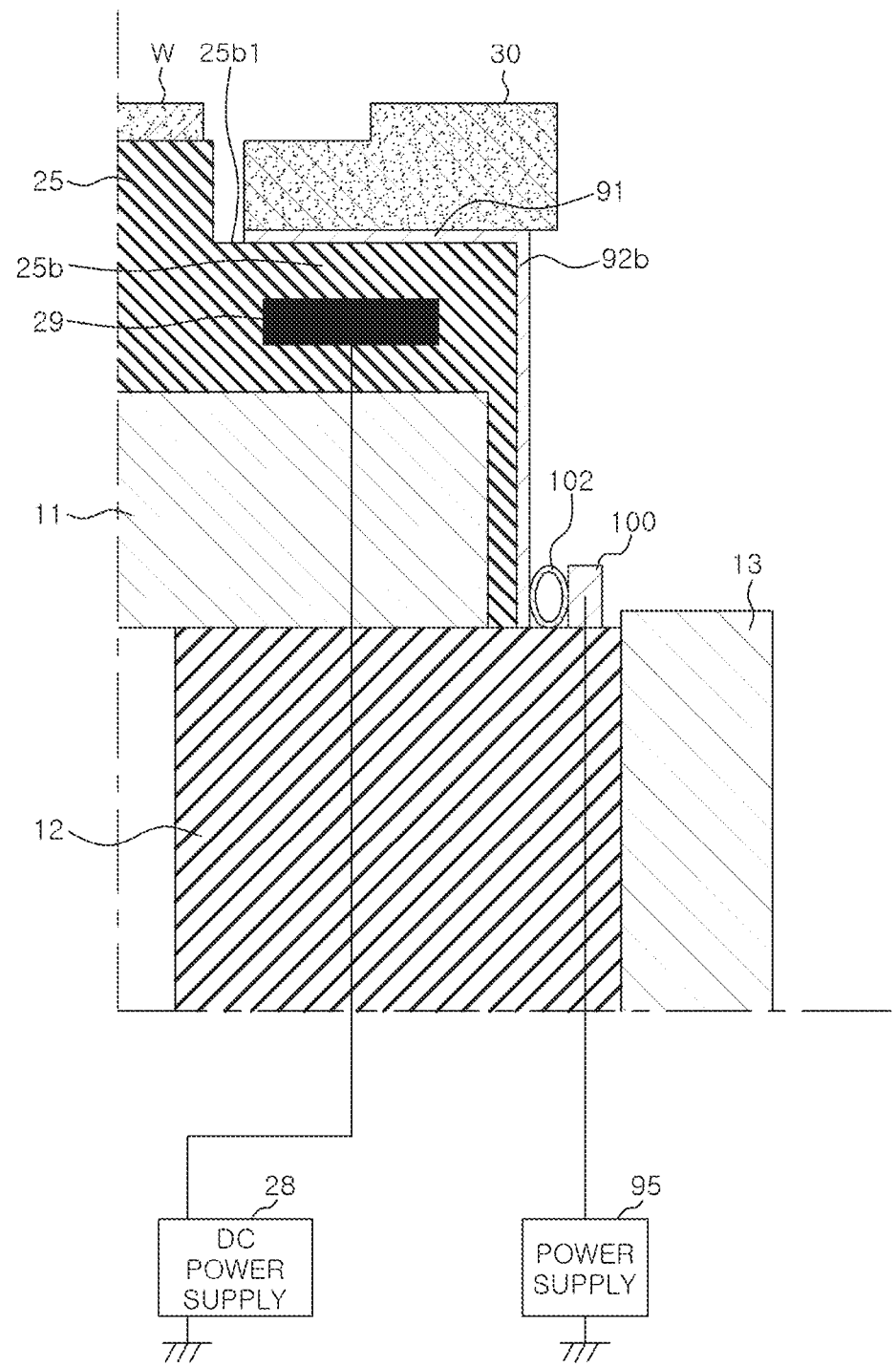
FIG. 5 is a diagram describing Modified Example of power feeding to the edge ring of the substrate processing apparatus according to the embodiment.

FIG. 5 is a diagram describing Modified Example 2 of power feeding to the edge ring 30 of the substrate processing apparatus 1 according to the embodiment. In Modified Example 2, the terminal 100 and a wiring 92b are connected by a multi-contact 102. The wiring 92b is provided on the side surfaces of the electrostatic chuck 25 and the base 11. The multi-contact 102 feeds power to the wiring 92b while pressing the side surface of the wiring 92b. In this manner, power can be stably fed to the edge ring 30. In addition, the multi-contact 102 is an example of an elastic member that feeds power while pressing the side surface of the first wiring.

Modified Example 3

Figure 6:
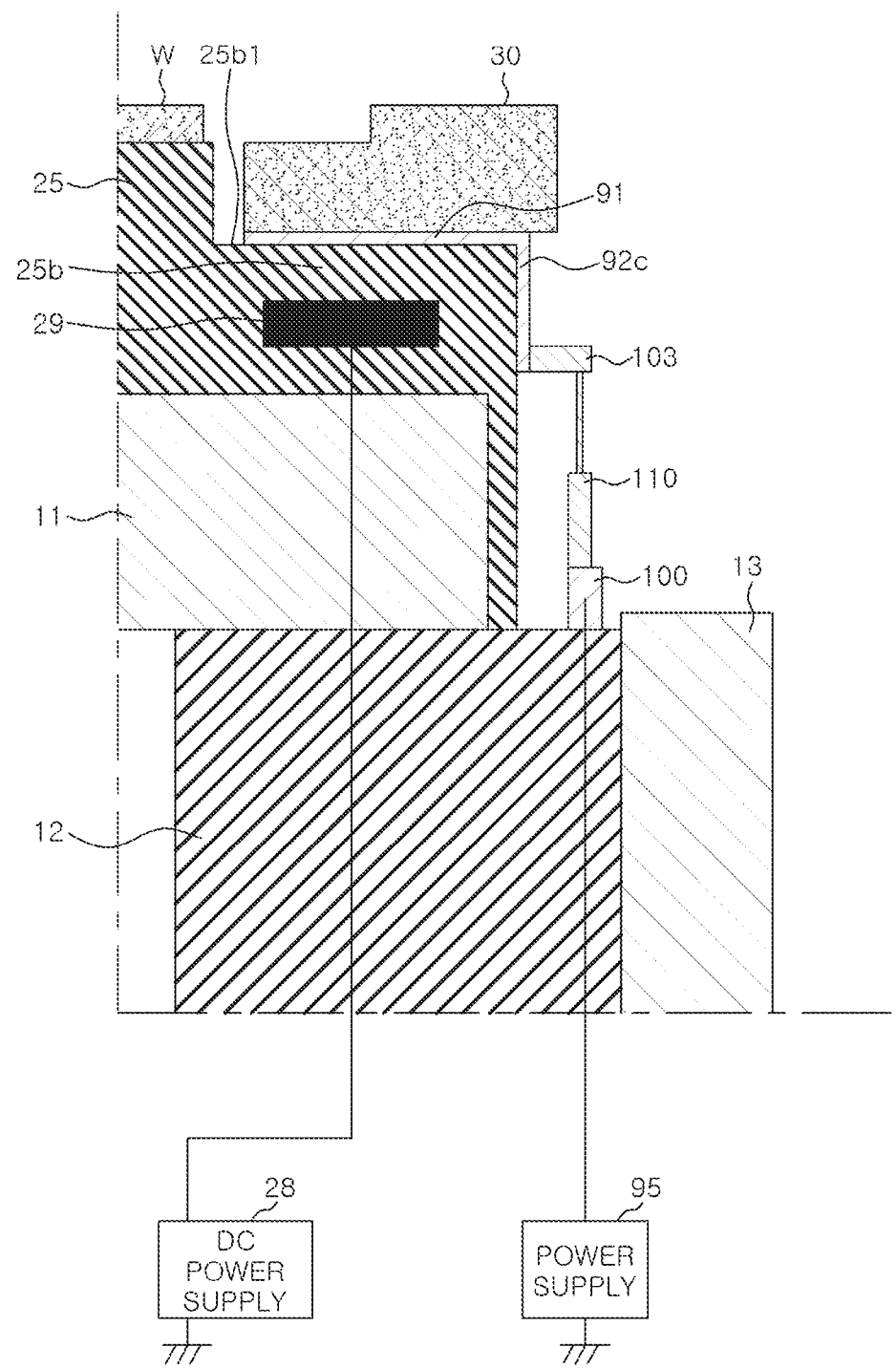
FIG. 6 is a diagram describing Modified Example of power feeding to the edge ring of the substrate processing apparatus according to the embodiment.

FIG. 6 is a diagram describing Modified Example 3 of power feeding to the edge ring 30 of the substrate processing apparatus 1 according to the embodiment. In the Modified Example 3, a terminal 103 is provided on a wiring 92c, and the terminal 103 and the terminal 100 are connected by a power feeding pin 110. The wiring 92c is provided on the side surface of the electrostatic chuck 25. In this manner, power can be stably fed to the edge ring 30.

Modified Example 4

Figure 7:
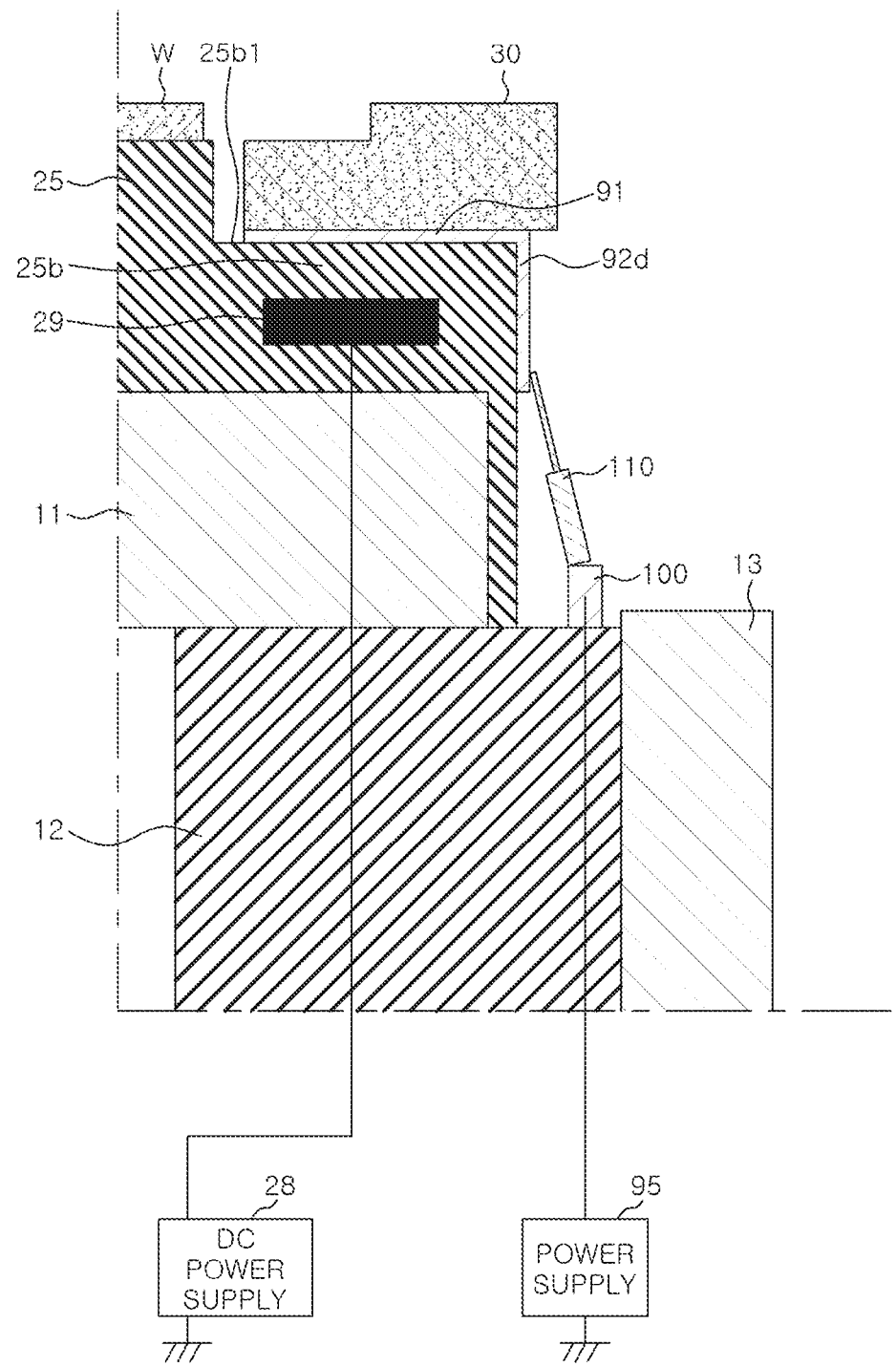
FIG. 7 is a diagram describing Modified Example of power feeding to the edge ring of the substrate processing apparatus according to the embodiment.

FIG. 7 is a diagram describing Modified Example 4 of power feeding to the edge ring 30 of the substrate processing apparatus 1 according to the embodiment. In Modified Example 4, a wiring 92d and the terminal 100 are connected by the power feeding pin 110. The wiring 92d is provided on the side surface of the electrostatic chuck 25. In this manner, power can be stably fed to the edge ring 30.

Modified Example 5

Figure 8:
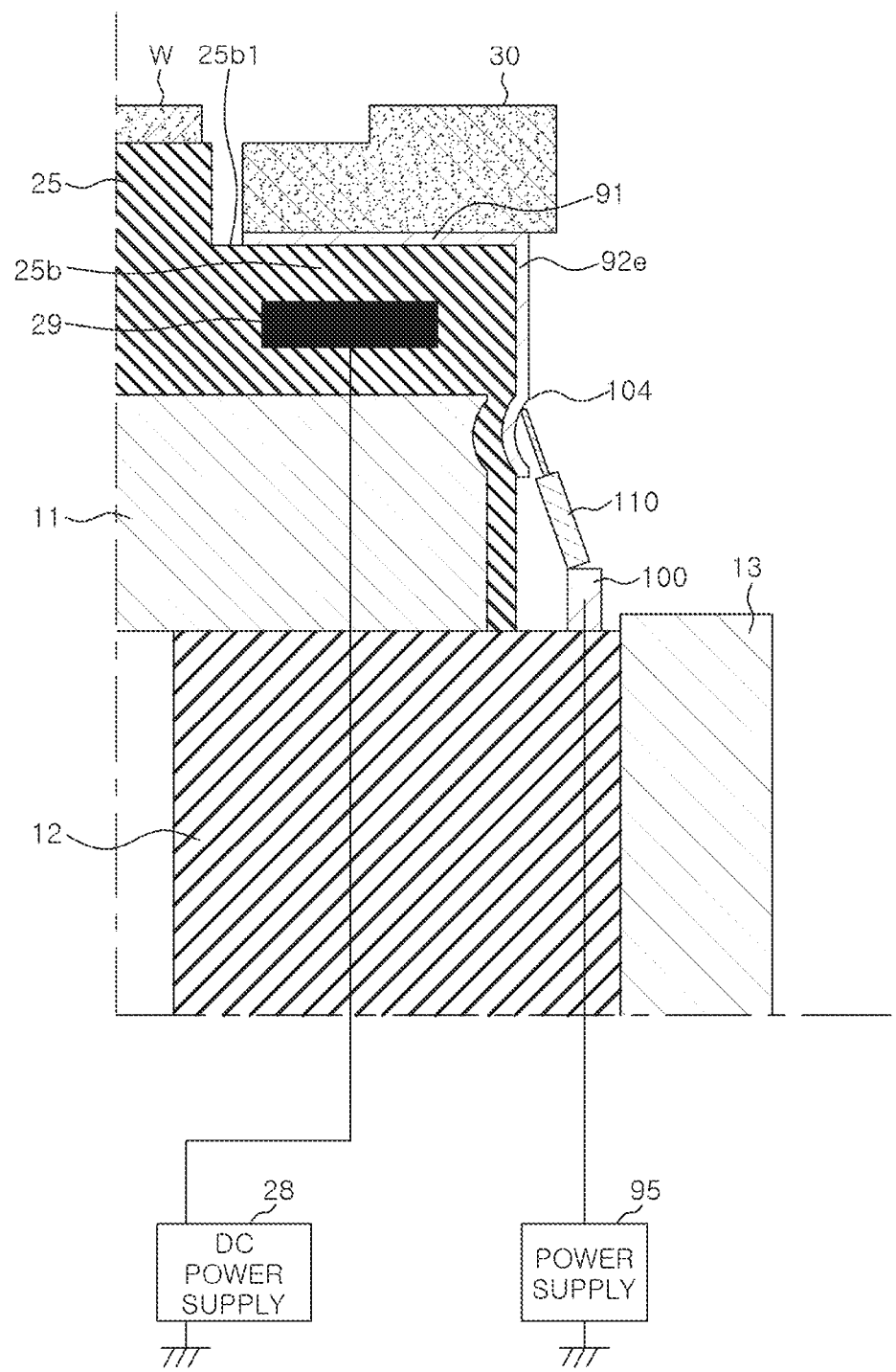
FIG. 8 is a diagram describing Modified Example of power feeding to the edge ring of the substrate processing apparatus according to the embodiment.

FIG. 8 is a diagram describing Modified Example 5 of power feeding to the edge ring 30 of the substrate processing apparatus 1 according to the embodiment. In the Modified Example 5, a concave portion 104 is formed in a wiring 92e, and the concave portion 104 and the terminal 100 are connected by the power feeding pin 110. The wiring 92e is provided on the side surfaces of the electrostatic chuck 25 and the base 11. In this manner, power can be stably fed to the edge ring 30.

Modified Example 6

Figure 9:
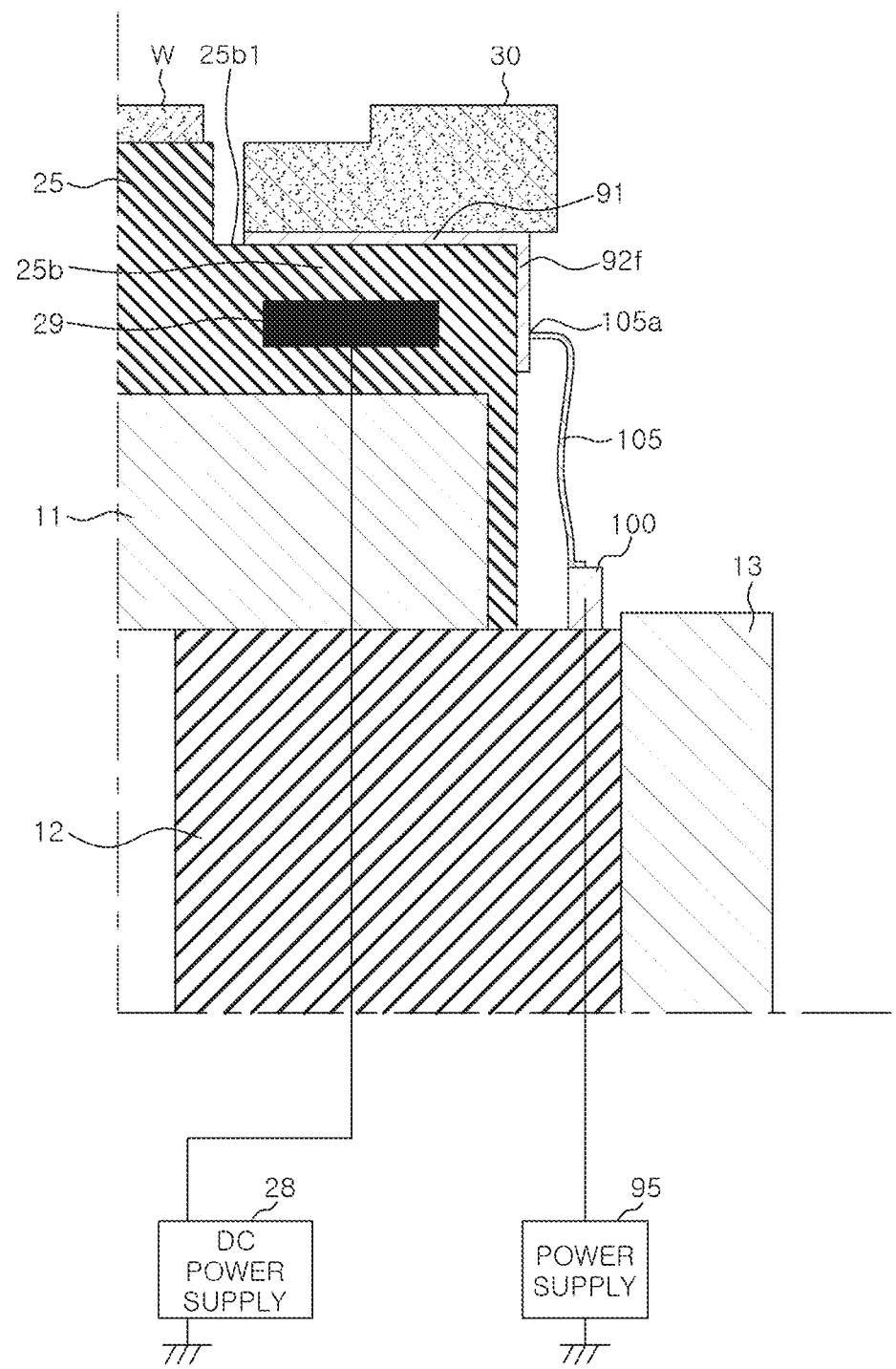
FIG. 9 is a diagram describing Modified Example of power feeding to the edge ring of the substrate processing apparatus according to the embodiment.

FIG. 9 is a diagram describing Modified Example 6 of power feeding to the edge ring 30 of the substrate processing apparatus 1 according to the embodiment. In Modified Example 6, a wiring 92f and the terminal 100 are connected by a lead wire 105. The wiring 92f is provided on the side surface of the electrostatic chuck 25. The wiring 92f and the lead wire 105 are connected by spot welding. In this manner, power can be stably fed to the edge ring 30.

Modified Example 7

Figure 10:
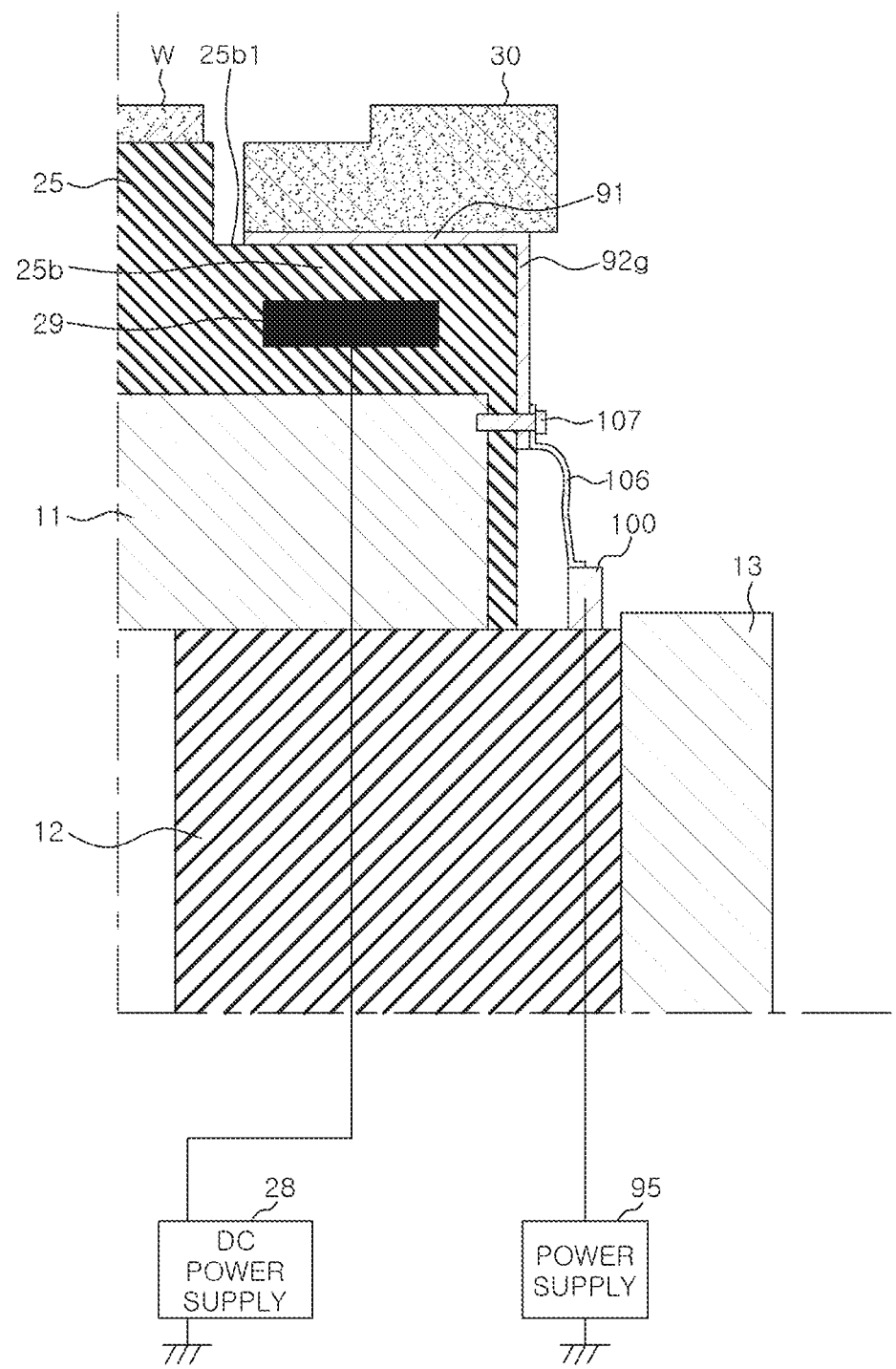
FIG. 10 is a diagram describing Modified Example of power feeding to the edge ring of the substrate processing apparatus according to the embodiment.

FIG. 10 is a diagram describing Modified Example 7 of power feeding to the edge ring 30 of the substrate processing apparatus 1 according to the embodiment. In the Modified Example 7, a wiring 92g and the terminal 100 are connected by a lead wire 106. The wiring 92g is provided on the side surface of the electrostatic chuck 25. The lead wire 106 is connected to the base 11 from above the wiring 92g by being attached with an insulating screw 107. In this manner, power can be stably fed to the edge ring 30.

Other Modified Examples

It should be understood that the substrate support, the substrate processing apparatus, and the edge ring according to the embodiment disclosed this time are examples in all respects and are not restrictive. The above-described embodiments can be modified and improved in various forms without departing from the scope and spirit of the appended claims. The matters described in the above-described plurality of embodiments can have other configurations as long as the configurations do not conflict with each other, and the matters can be combined with each other as long as the configuration do not conflict.

The substrate processing apparatus according to the disclosure can be applied to any type of a capacitively coupled plasma (CCP), an inductively coupled plasma (ICP), an apparatus for generating plasma by microwaves, for example, plasma generated by a radial line slot antenna (RLSA), an electron cyclotron resonance plasma (ECR), and a helicon wave plasma (HWP), or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The invention claimed is:

1. A substrate support comprising:
   a substrate mounting surface on which a substrate is mounted;
   an edge ring mounting surface on which an edge ring is mounted around the substrate mounting surface;
   wherein the substrate support includes a base and an electrostatic chuck for chucking the substrate in a dielectric material over the base;
   wherein the dielectric material covers the sides of the base and extends at least partially under the base;
   a conductive electrode formed on the edge ring mounting surface and configured to apply a voltage to the edge ring,
   wherein the conductive electrode is exposed to the edge ring mounting surface and contacts with a back surface of the edge ring,
   wherein a feeding wiring
   embedded in the dielectric material wraps around the electrostatic chuck, side of the base and at least partially under the base and provides power to the conductive electrode;
   a chucking electrode for attracting the edge ring embedded in the dielectric below the feeding wire;
   wherein the conductive electrode is configured to supply a voltage to the edge ring and is formed on the dielectric material so that at least a part of the dielectric material is exposed on the edge ring mounting surface.

2. The substrate support according to claim 1, wherein the conductive electrode is a conductive film.

3. The substrate support according to claim 2, wherein the conductive film is formed by any one selected from the group consisting of physical vapor deposition, chemical vapor deposition, plating, coating, sol-gel, spin coating, thermal spraying, and printing.

4. The substrate support according to claim 1, wherein the conductive electrode is made of gold, aluminum, tungsten, nickel, germanium, antimony, tellurium, tantalum, titanium, ruthenium, platinum, molybdenum, tin, indium, or an alloy containing any one thereof.

5. The substrate support according to claim 1, wherein the conductive electrode has a plurality of power feeding portions on the edge ring mounting surface and is configured to supply a DC voltage or a radio frequency power to each of the plurality of power feeding portions.

6. The substrate support according to claim 5, wherein the DC voltage or radio frequency power is supplied in a pulsed shape.

7. The substrate support according to claim 5, wherein the plurality of power feeding portions are provided at equal intervals on the edge ring mounting surface.

8. The substrate support according to claim 5, wherein the plurality of power feeding portions are provided radially on the edge ring mounting surface.

9. The substrate support according to claim 5, wherein the plurality of power feeding portions are provided in a ring shape on the edge ring mounting surface.

10. The substrate support according to claim 5, wherein a first wiring connected to the plurality of power feeding portions is provided on a side surface of the substrate support, and power is fed to the plurality of power feeding portions via the first wiring.

11. A substrate processing apparatus comprising a substrate support, wherein the substrate support includes:
    a substrate mounting surface on which a substrate is mounted;
    an edge ring mounting surface on which an edge ring is mounted around the substrate mounting surface;
    wherein the substrate support includes a base and an electrostatic chuck for chucking the substrate in a dielectric material over the base;
    wherein the dielectric material covers the sides of the base and extends at least partially under the base;
    a conductive electrode formed on the edge ring mounting surface and configured to supply a voltage to the edge ring,
    wherein the conductive electrode is exposed to the edge ring mounting surface and contacts with a back surface of the edge ring,
    wherein a feeding wiring
    embedded in the dielectric material wraps around the electrostatic chuck, side of the base and at least partially under the base and provides power to the conductive electrode;
    a chucking electrode for attracting the edge ring embedded in the dielectric below the feeding wire;
    wherein the conductive electrode is configured to supply a voltage to the edge ring and is formed on the dielectric material so that at least a part of the dielectric material is exposed on the edge ring mounting surface.

* * * * *